United States Patent
Kawashima (10) Patent No.: US 10,861,713 B2
(45) Date of Patent: Dec. 8, 2020

(54) SEMICONDUCTOR DEVICE

(71) Applicant: DENSO CORPORATION, Kariya (JP)

(72) Inventor: Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/517,728

(22) Filed: Jul. 22, 2019

(65) Prior Publication Data

US 2020/0066546 A1  Feb. 27, 2020

(30) Foreign Application Priority Data

Aug. 22, 2018 (JP) .................................. 2018-155589

(51) Int. Cl.
  *H01L 21/48* (2006.01)
  *H01L 21/56* (2006.01)
  *H01L 21/60* (2006.01)

(52) U.S. Cl.
  CPC .......... *H01L 21/4871* (2013.01); *H01L 21/56* (2013.01); *H01L 2021/6009* (2013.01); *H01L 2924/183* (2013.01)

(58) Field of Classification Search
  CPC .................................................. H01L 21/4871
  See application file for complete search history.

(56) References Cited

U.S. PATENT DOCUMENTS

2014/0203423 A1* 7/2014 Hayashi .................. H01L 21/56
  257/690
2016/0343630 A1* 11/2016 Kadoguchi ......... H01L 23/4952

FOREIGN PATENT DOCUMENTS

JP       2015-126119 A    7/2015

* cited by examiner

*Primary Examiner* — Mohammad M Choudhry
(74) *Attorney, Agent, or Firm* — Oliff PLC (57) ABSTRACT

A semiconductor device may include first and second conductor plates opposed to each other via first and second semiconductor chips, a first conductor spacer interposed between the first semiconductor chip and the second conductor plate, a second conductor spacer interposed between the second semiconductor chip and the second conductor plate, and an encapsulant provided between the first and second conductor plates. A lower surface of the second conductor plate may include a first joint area where the first conductor spacer is joined, a second joint area where the second conductor spacer is joined, an adhesion area to which the encapsulant adheres, and a separation area from which the encapsulant is separated. The adhesion area may surround the first joint area, the second joint area, and the separation area. The separation area may be located between the first and the second joint areas.

18 Claims, 6 Drawing Sheets

SEMICONDUCTOR DEVICE

CROSS-REFERENCE

This application claims priority to Japanese Patent Application No. 2018-155589, filed on Aug. 22, 2018, the entire contents of which are incorporated herein by reference.

TECHNICAL FIELD

The technique disclosed herein relates to a semiconductor device.

BACKGROUND

Japanese Patent Application Publication No. 2015-126119 describes a semiconductor device. This semiconductor device includes a pair of conductor plates, a plurality of semiconductor chips interposed between the conductor plates, a plurality of copper plate spacers, each of which is interposed between one of the conductor plates and a corresponding one of the plurality of semiconductor chips, and an encapsulant provided between the conductor plates and encapsulating each of the semiconductor chips.

SUMMARY

In such type of semiconductor device, each semiconductor chip surely needs to be kept sealed by an encapsulant. For this reason, conventional techniques have placed importance on increasing adhesion between conductor plates and an encapsulant. With regard to this point, Japanese Patent Application Publication No. 2015-126119 describes a technique of increasing adhesion between the conductor plates and the encapsulant by providing a groove in each of the conductor plates. However, depending on sizes and/or designs of semiconductor devices, large tensile stress may be generated at an interface between conductor plates and an encapsulant due to thermal contraction (or cure shrinkage) during when the encapsulant is formed. The tensile stress generated at the interface between the conductor plates and the encapsulant tends to increase, especially, in a region between adjacent two semiconductor chips. Thus, it is difficult to completely avoid separation between the conductor plates and the encapsulant, and sealability for the semiconductor chips may thereby be deteriorated. In view of such a situation, the disclosure herein provides a novel and useful technique for maintaining sealability for semiconductor chips by an encapsulant.

A semiconductor device disclosed herein may comprise a first conductor plate, a first semiconductor chip and a second semiconductor chip each located on the first conductor plate, a second conductor plate opposed to the first conductor plate with the first semiconductor chip and the second semiconductor chip interposed therebetween, a first conductor spacer interposed between the first semiconductor chip and a lower surface of the second conductor plate, a second conductor spacer interposed between the second semiconductor chip and the lower surface of the second conductor plate, and an encapsulant provided between the first conductor plate and the second conductor plate and encapsulating the first semiconductor chip and the second semiconductor chip. The lower surface of the second conductor plate may comprise a first joint area where the first conductor spacer is joined, a second joint area where the second conductor spacer is joined, an adhesion area to which the encapsulant adheres, and a separation area from which the encapsulant is separated. The adhesion area may surround the first joint area, the second joint area, and the separation area. The separation area may be located between the first joint area and the second joint area.

In the above semiconductor device, the separation area is provided on the lower surface of the second conductor plate. In that separation area, the encapsulant is intentionally separated from the second conductor plate. By separating the encapsulant from the second conductor plate, it is possible to reduce tensile stress at an interface between the encapsulant and the first conductor plate which is located opposite to the second conductor plate. Therefore, it is possible to avoid separation between the first conductor plate and the encapsulant.

The separation area is located between the first joint area and the second joint area. In this configuration, the tensile stress generated at the interface between the first conductor plate and the encapsulant can be reduced in a region between the adjacent two semiconductor chips. The tensile stress generated at the interface between the first conductor plate and the encapsulant tends to increase locally in the region between the adjacent two semiconductor chips. Therefore, by providing the separation area between the first joint area and the second joint area, it is possible to effectively reduce the tensile stress generated at the interface between the first conductor plate and the encapsulant. Accordingly, the first conductor plate and the encapsulant can be effectively suppressed from separating from each other.

The second conductor plate is joined to both of the semiconductor chips via the conductor spacers and is relatively far from the semiconductor chips. Therefore, even when the second conductor plate and the encapsulant are partly separated from each other, it is possible to substantially maintain sealability for the first and second semiconductor chips. In particular, the separation area is surrounded by the adhesion area. Therefore, foreign matter, such as moisture, does not enter between the second conductor plate and the encapsulant, and it is possible to avoid unintentional expansion of the separation area.

It should be noted that the term "lower surface" of the second conductor plate is used merely for the sake of convenience, but does not place any limitation on a posture of the semiconductor device in use or in manufacturing. In the present disclosure, one surface of the second conductor plate, among a plurality of surfaces thereof, that is opposed to the first conductor plate and is joined to the conductor spacers within the encapsulant is referred to as the "lower surface".

DETAILED DESCRIPTION

In an embodiment of the present disclosure, a surface roughness of a separation area may be smaller than a surface roughness of an adhesion area. In this configuration, adhesion of an encapsulant to the separation area is smaller than adhesion of the encapsulant to the adhesion area. Therefore, it is possible to intentionally separate the encapsulant from the separation area by using thermal contraction (or cure shrinkage) of the encapsulant when the encapsulant is formed.

In an embodiment of the present disclosure, a distance between the separation area and the encapsulant may be equal to or less than 5 micrometers. Although the separation area does not adhere (i.e. is not fixed to) the encapsulant, the separation area may come into contact with the encapsulant, accompanying thermal expansion of a second conductor plate or the encapsulant, for example.

In an embodiment of the present disclosure, an outline of the separation area may be a rectangle, a polygon, a circle, an ellipse, or an oval. However, the outline of the separation area is not limited thereto, and can be designed freely.

In an embodiment of the present disclosure, the separation area may extend so as to reach at least one of a first joint area and a second joint area. Since this configuration enables the separation area to be provided broadly, it is possible to more largely reduce tensile stress generated at an interface between a first conductor plate and the encapsulant.

In an embodiment of the present disclosure, the separation area may be separated from at least one of the first joint area and the second joint area by the adhesion area. Since this configuration enables the adhesion area to be provided broadly, it is possible to increase mechanical strength of a semiconductor device.

In an embodiment of the present disclosure, a first semiconductor chip and a second semiconductor chip may be arranged along a first direction on the first conductor plate. In this case, in a plan view along a direction perpendicular to the first conductor plate, a dimension of the separation area in a second direction perpendicular to the first direction may be greater than at least one of dimensions of the first semiconductor chip and the second semiconductor chip in the second direction. Since this configuration enables the separation area to be provided broadly, it is possible to more largely reduce tensile stress generated at the interface between the first conductor plate and the encapsulant.

In an embodiment of the present disclosure, the first semiconductor chip and the second semiconductor chip may be arranged along the first direction on the first conductor plate. In this case, in a plan view along the direction perpendicular to the first conductor plate, the dimension of the separation area in the second direction perpendicular to the first direction may be smaller than at least one of dimensions of the first semiconductor chip and the second semiconductor chip in the second direction. Since this configuration enables the adhesion area to be provided broadly, it is possible to increase mechanical strength of the semiconductor device.

In an embodiment of the present disclosure, the separation area may be a single area and may exist between the first joint area and the second joint area. However, in another embodiment, the separation area may include a plurality of separation areas and the plurality of separation areas may exist between the first joint area and the second joint area. In both the embodiments, it is possible to more largely reduce tensile stress generated at the interface between the first conductor plate and the encapsulant with the separation area provided more broadly.

In an embodiment of the present disclosure, the semiconductor device may further comprise a third semiconductor chip located on the first conductor plate and a third conductor spacer interposed between the third semiconductor chip and a lower surface of the second conductor plate. In this case, the lower surface of the second conductor plate may further comprise a third joint area where the third conductor spacer is joined and a second separation area from which the encapsulant is separated. The adhesion area may further surround the third joint area and the second separation area. The second separation area may be located between the second joint area and the third joint area. As above, the semiconductor device may comprise three or more semiconductor chips. In this case, one or more separation areas may be provided between each pair of the adjacent semiconductor chips.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Referring to the drawings, a semiconductor device 10 according to an embodiment will be described. The semiconductor device 10 can be employed in a power conversion circuit, such as a converter or an inverter, in an electric vehicle, for example. The electric vehicle described herein widely means an automobile including a motor for driving wheels, and examples of that electric vehicle include an electric vehicle charged with external power, a hybrid vehicle including an engine in addition to a motor, a fuel cell vehicle that uses a fuel cell as its power source, and the like.

As illustrated in FIGS. 1 to 4, the semiconductor device 10 includes a first conductor plate 12, a second conductor plate 14, a plurality of semiconductor chips 22, 24, and 26, and an encapsulant 16. The first conductor plate 12 and the second conductor plate 14 are parallel to each other and are opposed to each other. In one example, the plurality of the semiconductor chips 22, 24, and 26 include a first semiconductor chip 22, a second semiconductor chip 24, and a third semiconductor chip 26. The first semiconductor chip 22, the second semiconductor chip 24, and the third semiconductor chip 26 are linearly arranged along a longitudinal direction of the first conductor plate 12 and the second conductor plate 14 (a right-left direction in FIG. 2).

Figure 2:
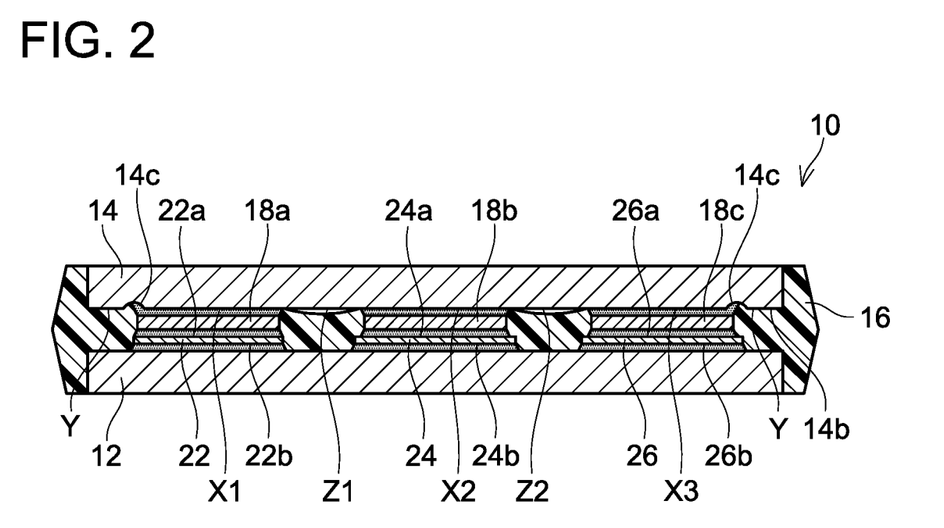
FIG. 2 illustrates a cross-sectional structure of the semiconductor device 10.
Figure 3:
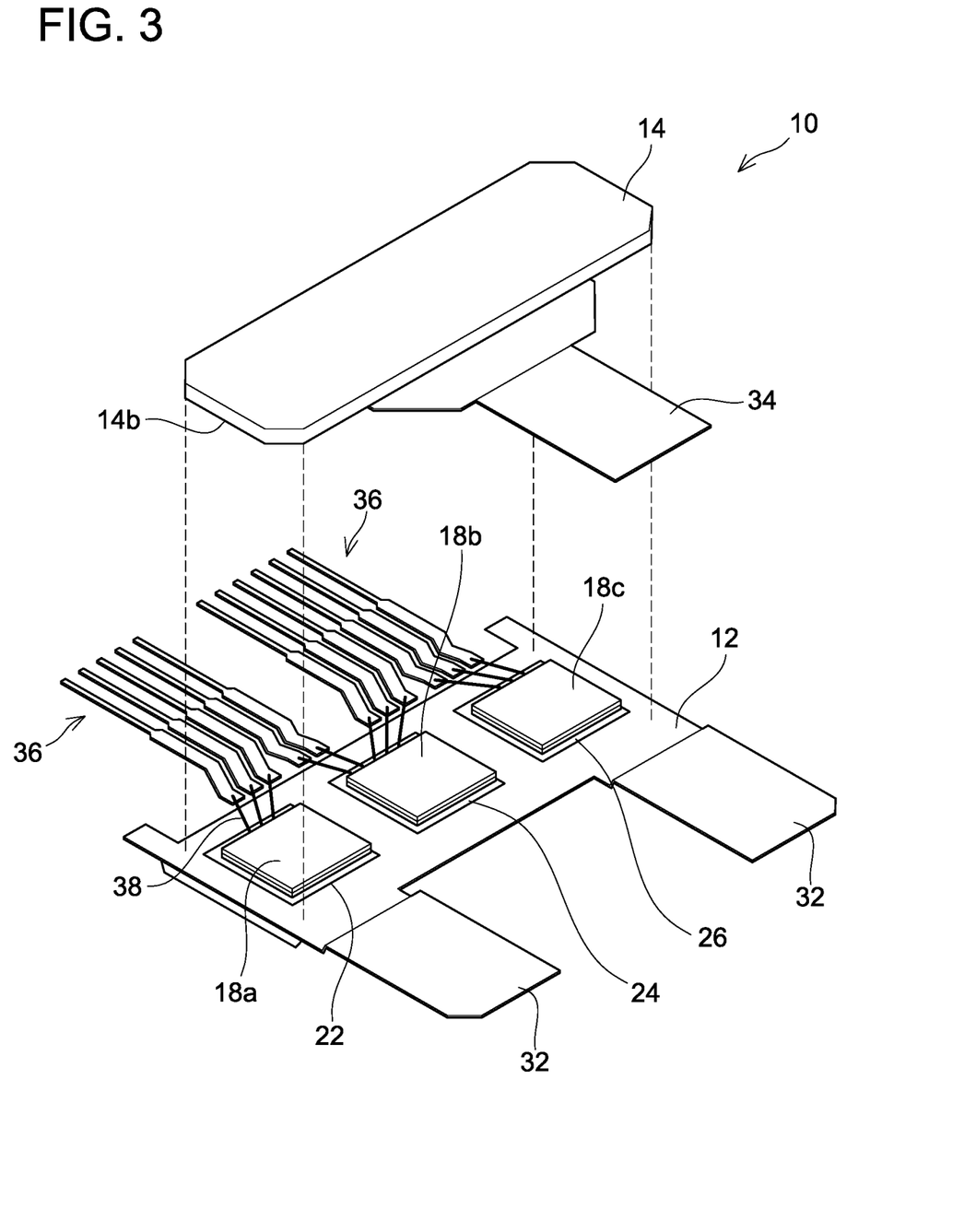
FIG. 3 is an exploded perspective view illustrating an internal structure of the semiconductor device 10, in which some constituent elements are not illustrated.

Each of the first conductor plate 12 and the second conductor plate 14 is constituted of a conductor, such as copper or another metal. The first conductor plate 12 and the second conductor plate 14 are opposed to each other with the semiconductor chips 22, 24, and 26 interposed therebetween. Each of the semiconductor chips 22, 24, and 26 is connected to the first conductor plate 12 and is also connected to the second conductor plate 14. That said, a first conductor spacer 18a is interposed between the first semiconductor chip 22 and the second conductor plate 14. Similarly, a second conductor spacer 18b is interposed between the second semiconductor chip 24 and the second conductor plate 14, and a third conductor spacer 18c is interposed between the third semiconductor chip 26 and the second conductor plate 14. That is, while the semiconductor chips 22, 24, and 26 are connected directly to the first conductor plate 12, they are connected to the second conductor plate 14 via the conductor spacers 18a, 18b, and 18c. These connections employ solder joint, although not specifically limited thereto.

Specific configurations of the first conductor plate 12 and the second conductor plate 14 are not specifically limited. For example, in another embodiment, at least one of the first conductor plate 12 and the second conductor plate 14 may be an insulting substrate including an intermediate layer constituted of an insulator (e.g., ceramic), such as a DBC (Direct Bonded Copper) substrate. That is, each of the first conductor plate 12 and the second conductor plate 14 may not necessarily entirely constituted of a conductor.

The first semiconductor chip 22, the second semiconductor chip 24, and the third semiconductor chip 26 are so-called power semiconductor chips for power circuit and have the same configuration as one another. The first semiconductor chip 22 includes an upper electrode 22a and a lower electrode 22b. The upper electrode 22a is located on an upper surface of the first semiconductor chip 22, and the lower electrode 22b is located on a lower surface of the first semiconductor chip 22. The upper electrode 22a is electrically connected to the second conductor plate 14 via the first conductor spacer 18a, and the lower electrode 22b is electrically connected to the first conductor plate 12. Similarly, the second semiconductor chip 24 includes an upper electrode 24a and a lower electrode 24b, and the third semiconductor chip 26 includes an upper electrode 26a and a lower electrode 26b. The upper electrodes 24a and 26a are electrically connected to the second conductor plate 14 via the conductor spacers 18b and 18c, respectively. The lower electrodes 24b and 26b are electrically connected to the first conductor plate 12.

Figure 4:
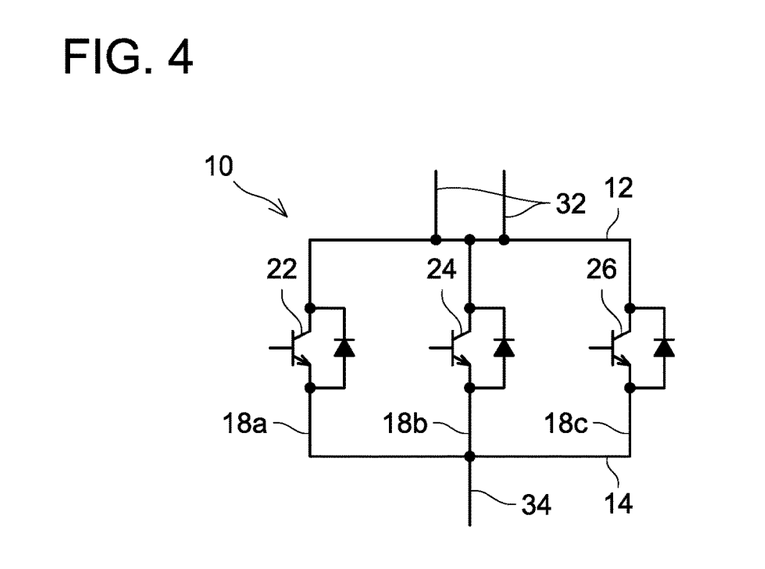
FIG. 4 is a circuit diagram illustrating an electrical configuration of the semiconductor device 10.

As illustrated in FIG. 4, each of the semiconductor chips 22, 24, and 26 in this embodiment is an RC-IGBT (Reverse Conducting Insulated Gate Bipolar Transistor) chip and includes both an IGBT structure and a diode structure, although this is merely an example. In the semiconductor chips 22, 24, and 26, emitters of the IGBT structures are respectively connected to the upper electrodes 22a, 24a, and 26a, and collectors of the IGBT structures are respectively connected to the lower electrodes 22b, 24b, and 26b. Further, anodes of the diode structures are respectively connected to the upper electrodes 22a, 24a, and 26a, and cathodes of the diode structures are respectively connected to the lower electrodes 22b, 24b, and 26b.

Specific type and structure of the semiconductor chips 22, 24, and 26 are not specifically limited. For example, the semiconductor chips 22, 24, and 26 may each include either one of the IGBT structure and the diode structure. Alternatively, the semiconductor chips 22, 24, and 26 may each include a MOSFET (Metal-Oxide-Semiconductor Field-Effect Transistor) structure in place of or in addition to the IGBT structure. Further, a semiconductor material used for the semiconductor chips 22, 24, and 26 is not specifically limited, and it may be, for example, silicon (Si), silicon carbide (SiC), or a nitride semiconductor such as gallium nitride (GaN).

The encapsulant 16 is provided between the first conductor plate 12 and the second conductor plate 14 and encapsulates each of the semiconductor chips 22, 24, and 26. The encapsulant 16 may be constituted, for example, of thermosetting resin such as epoxy resin, or another insulator, although not particularly limited thereto. The encapsulant 16 is also referred to as a mold resin or a package, for example. Although the semiconductor device 10 of this embodiment includes three semiconductor chips 22, 24, and 26, it suffices that a semiconductor device includes at least two semiconductor chips in another embodiment.

The first conductor plate 12 and the second conductor plate 14 are connected to the semiconductor chips 22, 24, and 26 not only electrically but also thermally. Further, the first conductor plate 12 and the second conductor plate 14 are each exposed at a surface of the encapsulant 16, thereby they can release heat of the semiconductor chips 22, 24, and 26 to outside of the encapsulant 16. As such, the semiconductor device 10 of this embodiment includes a double-sided cooling structure in which heat sinks are respectively arranged on both sides of the semiconductor chips 22, 24, and 26.

Figure 1:
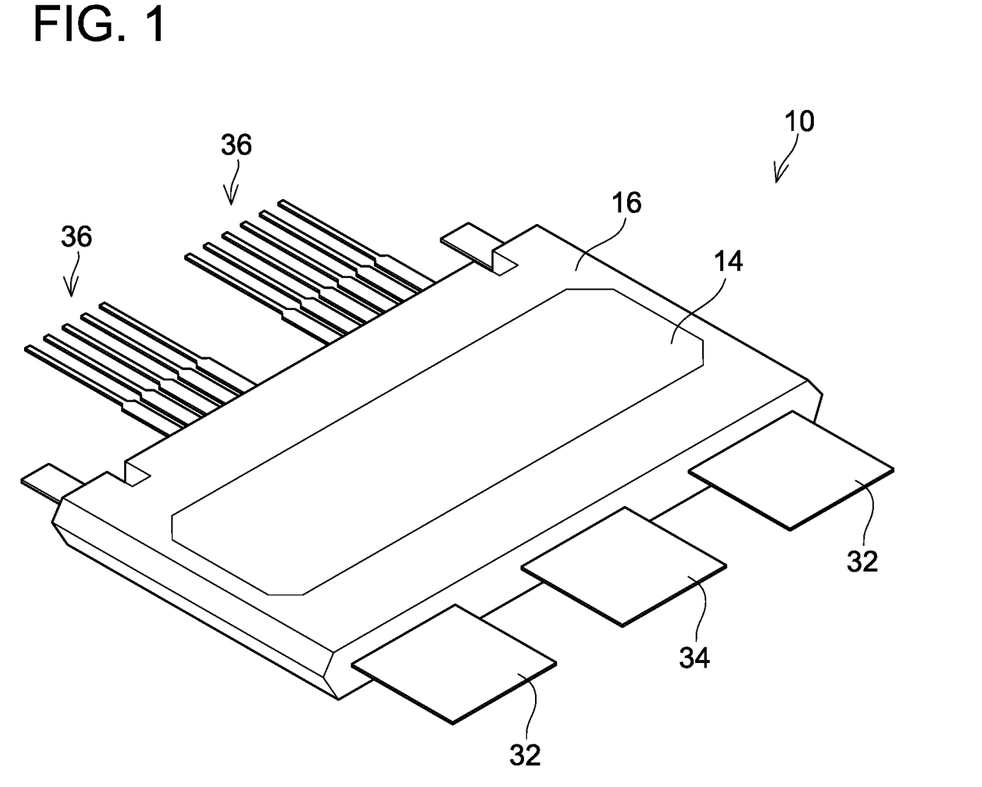
FIG. 1 is a perspective view illustrating an appearance of a semiconductor device 10.

The semiconductor device 10 further includes at least one first external connection terminal 32, at least one second external connection terminal 34, and a plurality of third external connection terminals 36. The external connection terminals 32, 34, and 36 are each constituted of a conductor such as copper or aluminum, and extend from inside of the encapsulant 16 to the outside. The first external connection terminal 32 is connected to the first conductor plate 12 inside the encapsulant 16. The second external connection terminal 34 is connected to the second conductor plate 14 inside the encapsulant 16. By these connections, the semiconductor chips 22, 24, and 26 are electrically connected in parallel to one another between the first external connection terminal 32 and the second external connection terminal 34. Each of the third external connection terminals 36 is connected to a corresponding one of signal pads (not illustrated) of the semiconductor chips 22, 24, and 26 via a bonding wire 38.

Figure 5:
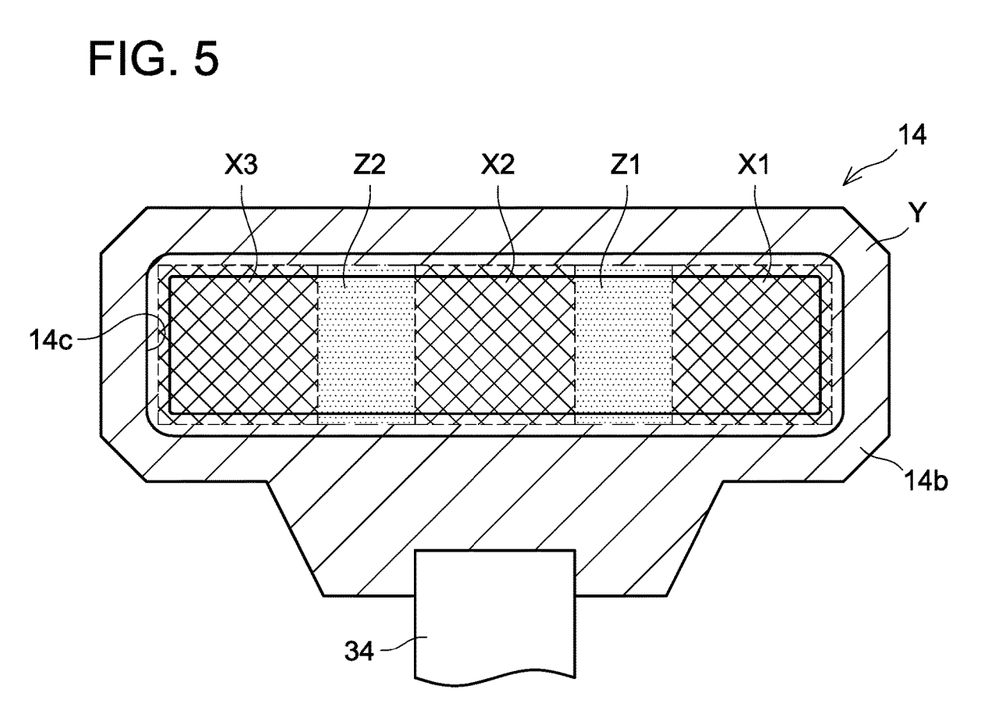
FIG. 5 illustrates a lower surface 14b of a second conductor plate 14, in which joint areas X1, X2, and X3 are cross-hatched, an adhesion area Y is hatched with downward-to-left diagonal stripe, and separation areas Z1 and Z2 are hatched with dots for convenience of illustration.

As illustrated in FIGS. 2 and 5, a lower surface 14b of the second conductor plate 14 includes a first joint area X1 where the first conductor spacer 18a is joined, a second joint area X2 where the second conductor spacer 18b is joined, a third joint area X3 where the third conductor spacer 18c is joined, an adhesion area Y to which the encapsulant 16 adheres, and a first separation area Z1 and a second separation area Z2 from which the encapsulant 16 is separated. The adhesion area Y surrounds the three joint areas X1, X2, and X3 and the two separation areas Z1 and Z2 to isolate these areas X1, X2, X3, Z1, and Z2 from the outside. The first separation area Z1 is located between the first joint area X1 and the second joint area X2, and the second separation area Z2 is located between the second joint area X2 and the third joint area X3. A groove 14c for absorbing excess solder is provided in the lower surface 14b of the second conductor plate 14.

In the semiconductor device 10 of this embodiment, the separation areas Z1 and Z2 are provided in the lower surface 14b of the second conductor plate 14. In those separation areas Z1 and Z2, the encapsulant 16 is intentionally separated from the second conductor plate 14. This separation of the encapsulant 16 from the second conductor plate 14 can reduce tensile stress due to thermal contraction or cure shrinkage of the encapsulant 16 at an interface between the first conductor plate 12 and the encapsulant 16 located on the opposite side to the separation with respect to the encapsulant 16. Therefore, it is possible to avoid separation between the first conductor plate 12 and the encapsulant 16.

The first separation area Z1 is located between the first joint area X1 and the second joint area X2. This configuration can reduce the tensile stress generated at the interface between the first conductor plate 12 and the encapsulant 16 in a region between the first and second semiconductor chips 22 and 24 that are adjacent to each other. The tensile stress generated at the interface between the first conductor plate 12 and the encapsulant 16 tends to increase locally in the region between the first and second semiconductor chips 22 and 24 that are adjacent to each other. Therefore, by providing the first separation area Z1 between the first joint area X1 and the second joint area X2, it is possible to effectively reduce the tensile stress generated at the interface between the first conductor plate 12 and the encapsulant 16. Accordingly, the first conductor plate 12 and the encapsulant 16 can effectively be suppressed from separating from each other.

The second conductor plate 14 is connected to the semiconductor chips 22, 24, and 26 via the conductor spacers 18a, 18b, and 18c, respectively, and is relatively far from the semiconductor chips 22, 24, and 26. Therefore, even when the second conductor plate 14 and the encapsulant 16 are partly separated from each other, it is possible to substantially maintain sealability for each of the semiconductor chips 22, 24, and 26. In particular, the first separation area Z1 is surrounded by the adhesion area Y. Therefore, foreign matter, such as moisture, does not enter between the second conductor plate 14 and the encapsulant 16, and unintentional expansion of the first separation area Z1 can be avoided.

The second separation area Z2 is located between the second joint area X2 and the third joint area X3. Therefore, the second separation area Z2 can reduce the tensile stress generated at the interface between the first conductor plate 12 and the encapsulant 16 in a region between the second and third semiconductor chips 24 and 26 that are adjacent to each other. The tensile stress generated at the interface between the first conductor plate 12 and the encapsulant 16 tends to increase locally also in the region between the second and third semiconductor chips 24 and 26 that are adjacent to each other. Therefore, by providing the second separation area Z2 between the second joint area X2 and the third joint area X3, the first conductor plate 12 and the encapsulant 16 can be effectively suppressed from separating from each other. In addition, since the second separation area Z2 is also surrounded by the adhesion area Y, the second separation area Z2 cannot expand unintentionally.

In the semiconductor device 10 of this embodiment, a surface roughness of each of the separation areas Z1 and Z2 is smaller than a surface roughness of the adhesion area Y. In this configuration, adhesion of the encapsulant 16 to the separation areas Z1 and Z2 is smaller than adhesion of the encapsulant 16 to the adhesion area Y. Therefore, when the encapsulant 16 is formed, for example, by molding, it is possible to intentionally separate the encapsulant 16 from the separation areas Z1 and Z2 by using thermal contraction (or cure shrinkage) of the encapsulant 16. In the semiconductor device 10 of this embodiment, the surface roughness of the adhesion area Y is made larger by laser irradiation to the adhesion area Y before the encapsulant 16 is formed, although this method is merely an example. However, a method of making adhesion of the encapsulant 16 to the adhesion area Y larger than that to the separation areas Z1 and Z2 is not limited to the above method. For example, adhesion of the encapsulant 16 to the adhesion area Y may be increased by applying a primer or another material on the adhesion area Y only. The laser irradiation may be performed to an inner surface of the groove 14c, or may not be performed thereto. However, when a boundary of a range to which the laser irradiation is performed is determined with the groove 14c as its reference, it is easy to accurately perform the laser irradiation and inspection of the laser radiation.

In the semiconductor device 10 of this embodiment, a distance between the encapsulant 16 and each of the separation areas Z1 and Z2 (that is, a thickness of a gap therebetween) is equal to or less than 2 micrometers. However, the distance between the encapsulant 16 and each of the separation areas Z1 and Z2 is not limited to 2 micrometers or less, and may be equal to or less than 5 micrometers, for example. It suffices that the separation areas Z1 and Z2 does not adhere (is not fixed to) the encapsulant 16, and the encapsulant 16 may come into contact with the separation area Z1 and/or Z2, for example, when the second conductor 14 and/or the encapsulant 16 thermally expands. That is, it suffices that the separation areas Z1 and Z2 are ranges to which the encapsulant 16 do not adhere and are areas that allow the encapsulant 16 to separate therefrom when the encapsulant 16 contracts.

Figure 6:
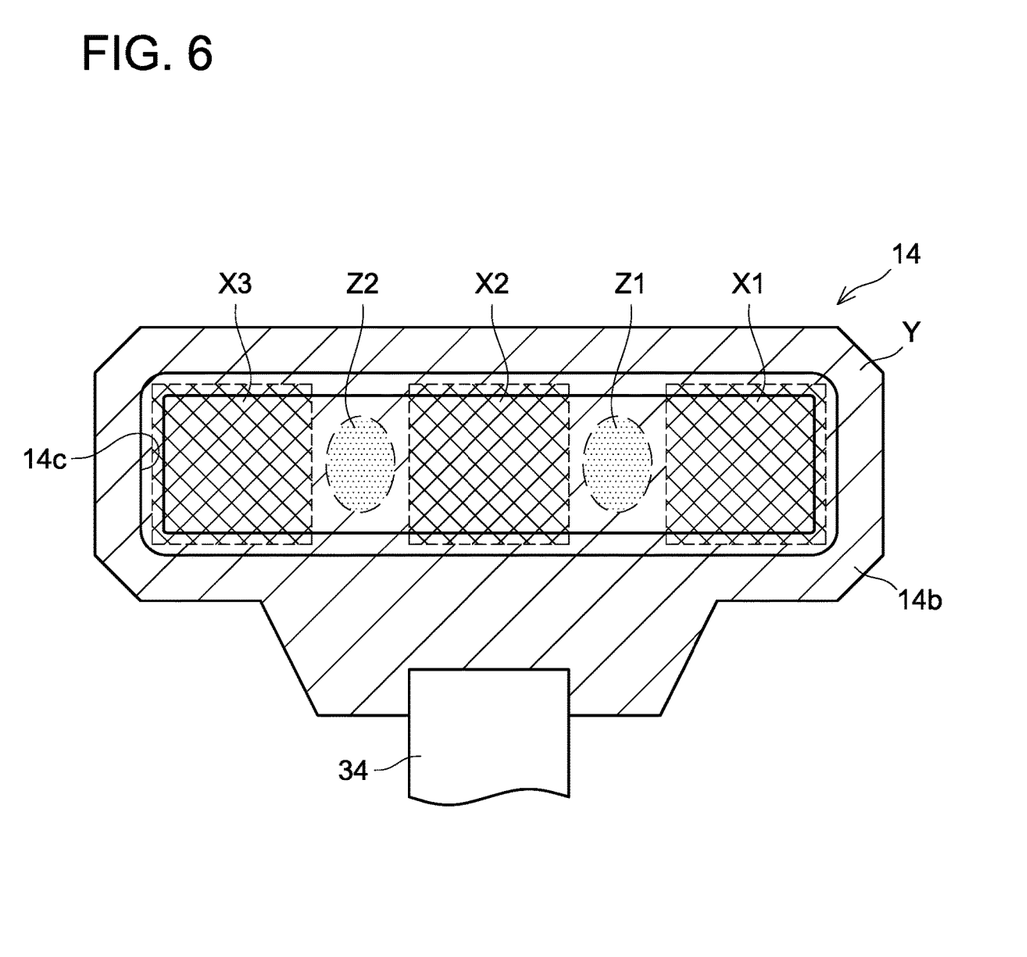
FIG. 6 illustrates a variant of the separation areas Z1 and Z2.

In the semiconductor device 10 of this embodiment, an outline of each of the separation areas Z1 and Z2 is a rectangle. However, as illustrated in FIG. 6, the outlines of the separation areas Z1 and Z2 are not limited to a rectangle, and may be another shape such as a polygon, a circle, an ellipse, or an oval. The outlines of the separation areas Z1 and Z2 are not limited to a specific shape, and may be freely designed.

In the semiconductor device 10 of this embodiment, the first separation area Z1 extends so as to reach the first joint area X1 and the second joint area X2. Similarly, the second separation area Z2 extends so as to reach the second joint area X2 and the third joint area X3. In this configuration, each of the separation areas Z1 and Z2 can be provided broadly and it is therefore possible to mire largely reduce the tensile stress generated at the interface between the first conductor plate 12 and the encapsulant 16. However, the first separation area Z1 may be separated from the first joint area X1 and the second joint area X2 by the adhesion area Y, as illustrated in FIG. 6. Similarly, the second separation area Z2 may be separated from the second joint area X2 and the third joint area X3 by the adhesion area Y. In this configuration, the adhesion area Y can be provided broadly and it is therefore possible to increase mechanical strength of the semiconductor device 10.

In the semiconductor device 10 of this embodiment, the semiconductor chips 22, 24, and 26 are arranged in a first direction (the right-left direction in FIGS. 2 and 5) on the first conductor plate 12. In this case, in a plan view along a direction perpendicular to the first conductor plate 12, dimensions of the separation areas Z1 and Z2 in a second direction (an up-down direction in FIG. 5) perpendicular to the first direction may be greater than dimensions of the semiconductor chips 22, 24, and 26 in the second direction. In this configuration, the separation areas Z1 and Z2 can be provided broadly, and it is therefore possible to more largely reduce the tensile stress generated at the interface between the first conductor plate 12 and the encapsulant 16. Alternatively, the dimensions of the separation areas Z1 and Z2 in the second direction may be smaller than the dimensions of the semiconductor chips 22, 24, and 26 in the second direction. In this configuration, the adhesion area Y can be provided broadly, and it is therefore possible to increase the mechanical strength of the semiconductor device 10.

In the semiconductor device 10 of this embodiment, a single first separation area Z1 exists between the first joint area X1 and the second joint area X2. However, in another embodiment, a plurality of first separation areas Z1 may exist between the first joint area X1 and the second joint area X2. Irrespective of the number of the first separation areas Z1, it is possible to more largely reduce the tensile stress generated at the interface between the first conductor plate 12 and the encapsulant 16 with the first separation area Z1 provided more broadly in the second conductor plate 14. Similarly, a single second separation area Z2 exists between the second joint area X2 and the third joint area X3 in the semiconductor device 10 of this embodiment. However, in another embodiment, a plurality of second separation areas Z2 may exist between the second joint area X2 and the third joint area X3.

Figure 7:
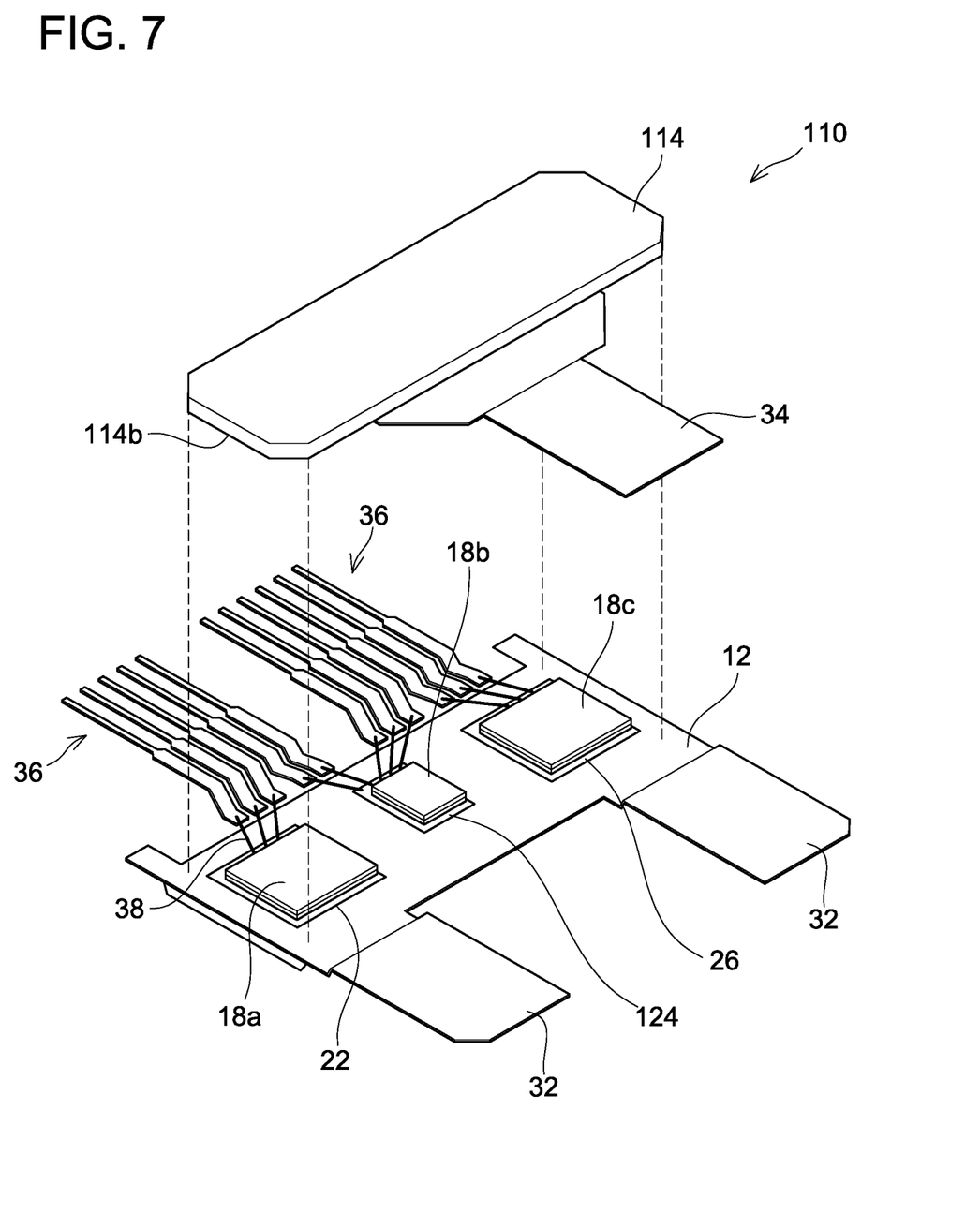
FIG. 7 is an exploded perspective view illustrating an internal structure of a semiconductor device 110 according to another embodiment, in which some constituent elements are not illustrated.

In the semiconductor device 10 of this embodiment, the semiconductor chips 22, 24, and 26 have the same configuration as one another. However, in another embodiment, one or more of the semiconductor chips 22, 24, and 26 may have a different configuration from the other(s). For example, in a semiconductor device 110 illustrated in FIGS. 7 and 8, the second semiconductor chip 124 is changed as compared with the semiconductor device 10 described above. Further, accompanying the change of the second semiconductor chip 124, the configuration of the second conductor plate 114 is also changed. In this semiconductor device 110, a semiconductor chip including a SiC substrate is used as the second semiconductor chip 124 and a size of the second semiconductor chip 124 is smaller than the size of the first semiconductor chip 22 and the size of the third semiconductor chip 26. As the first and third semiconductor chips 22 and 26, semiconductor chips including Si substrates are used. Further, while the first and third semiconductor chips 22 and 26 each have an RC-IGBT structure, the second semiconductor chip 124 has a MOSFET structure.

Figure 8:
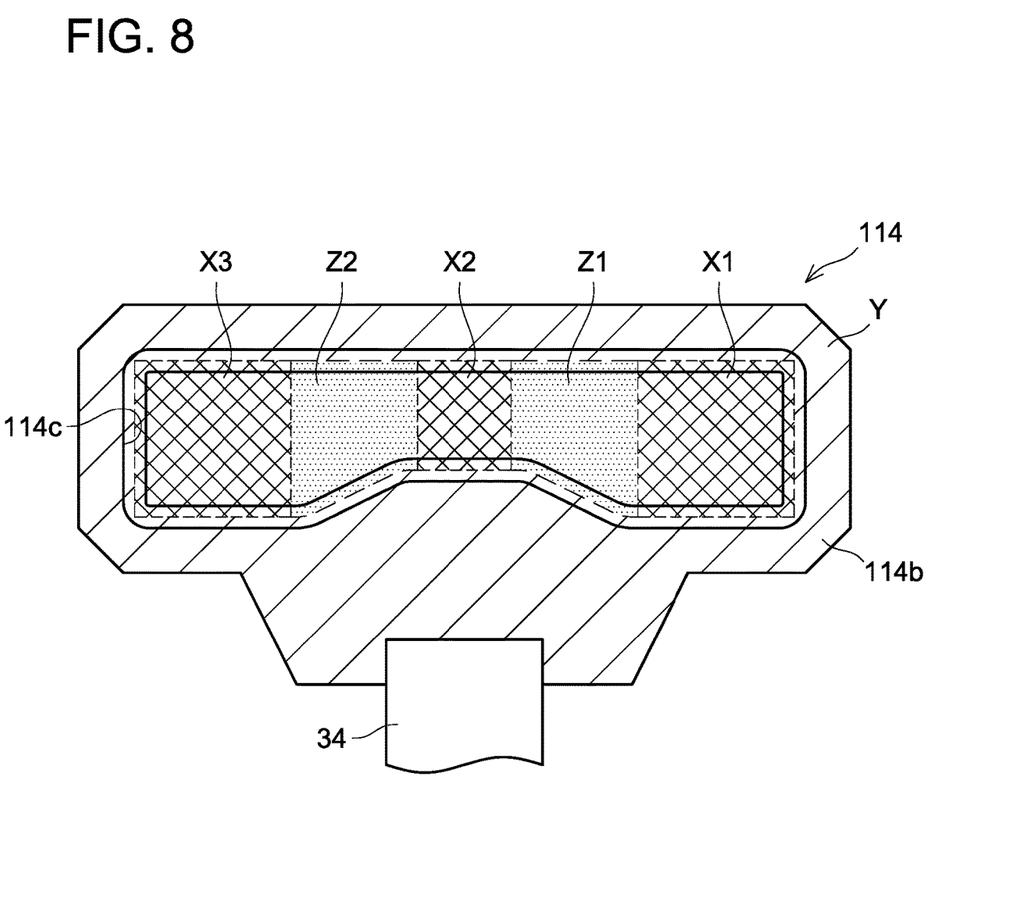
FIG. 8 illustrates a lower surface 114b of a second conductor plate 114 in the semiconductor device 110 according to the other embodiment.

As illustrated in FIG. 8, in this semiconductor device 110 as well, a lower surface 114b of the second conductor plate 114 includes the first joint area X1 where the first conductor spacer 18a is joined, the second joint area X2 where the second conductor spacer 18b is joined, the third joint area X3 where the third conductor spacer 18c is joined, the adhesion area Y to which the encapsulant 16 adheres, and the first and second separation areas Z1 and Z2 from which the encapsulant 16 is separated. The adhesion area Y surrounds the three joint areas X1, X2, and X3 and the two separation areas Z1 and Z2 to isolate these areas X1, X2, X3, Z1, and Z2 from the outside. The first separation area Z1 is located between the first joint area X1 and the second joint area X2, and the second separation area Z2 is located between the second joint area X2 and the third joint area X3. A groove 114c for absorbing excess solder is provided in the lower surface 114b of the second conductor plate 114 to follow positions of the semiconductor chips 22, 124, and 26.

What is claimed is:

1. A semiconductor device, comprising:
a first conductor plate;
a first semiconductor chip and a second semiconductor chip each located on the first conductor plate, the first semiconductor chip and the second semiconductor chip being arranged along a first direction on the first conductor plate;
a second conductor plate opposed to the first conductor plate with the first semiconductor chip and the second semiconductor chip interposed therebetween;
a first conductor spacer interposed between the first semiconductor chip and a lower surface of the second conductor plate;
a second conductor spacer interposed between the second semiconductor chip and the lower surface of the second conductor plate; and
an encapsulant provided between the first conductor plate and the second conductor plate and encapsulating the first semiconductor chip and the second semiconductor chip,
wherein
the lower surface of the second conductor plate comprises a first joint area where the first conductor spacer is joined, a second joint area where the second conductor spacer is joined, an adhesion area to which the encapsulant adheres, and a separation area from which the encapsulant is separated,
the adhesion area surrounds the first joint area, the second joint area, and the separation area,
the separation area is located between the first joint area and the second joint area, and
in a plan view along a direction perpendicular to the first conductor plate, a dimension of the separation area in a second direction is greater than at least one of dimensions of the first semiconductor chip and the second semiconductor chip in the second direction, the second direction being perpendicular to the first direction.

2. The semiconductor device according to claim 1, wherein a surface roughness of the separation area is smaller than a surface roughness of the adhesion area.

3. The semiconductor device according to claim 1, wherein a distance between the separation area and the encapsulant is equal to or less than 5 micrometers.

4. The semiconductor device according to claim 1, wherein an outline of the separation area is a rectangle, a polygon, a circle, an ellipse, or an oval.

5. The semiconductor device according to claim 1, wherein the separation area extends so as to reach at least one of the first joint area and the second joint area.

6. The semiconductor device according to claim 1, wherein the separation area is separated from at least one of the first joint area and the second joint area by the adhesion area.

7. The semiconductor device according to claim 1, wherein
the separation area is a single area, and the separation area exists between the first joint area and the second joint area.

8. The semiconductor device according to claim 1, wherein
the separation area includes a plurality of separation areas, and
the plurality of separation areas exists between the first joint area and the second joint area.

9. The semiconductor device according to claim 1, further comprising:
a third semiconductor chip located on the first conductor plate; and
a third conductor spacer interposed between the third semiconductor chip and the lower surface of the second conductor plate,
wherein
the lower surface of the second conductor plate further comprises a third joint area where the third conductor spacer is joined and a second separation area from which the encapsulant is separated,
the adhesion area further surrounds the third joint area and the second separation area, and
the second separation area is located between the second joint area and the third joint area.

10. A semiconductor device, comprising:
a first conductor plate;
a first semiconductor chip and a second semiconductor chip each located on the first conductor plate, the first semiconductor chip and the second semiconductor chip being arranged along a first direction on the first conductor plate;
a second conductor plate opposed to the first conductor plate with the first semiconductor chip and the second semiconductor chip interposed therebetween;
a first conductor spacer interposed between the first semiconductor chip and a lower surface of the second conductor plate;
a second conductor spacer interposed between the second semiconductor chip and the lower surface of the second conductor plate; and
an encapsulant provided between the first conductor plate and the second conductor plate and encapsulating the first semiconductor chip and the second semiconductor chip,
wherein
the lower surface of the second conductor plate comprises a first joint area where the first conductor spacer is joined, a second joint area where the second conductor spacer is joined, an adhesion area to which the encapsulant adheres, and a separation area from which the encapsulant is separated,
the adhesion area surrounds the first joint area, the second joint area, and the separation area,
the separation area is located between the first joint area and the second joint area, and
in a plan view along a direction perpendicular to the first conductor plate, a dimension of the separation area in a second direction is smaller than at least one of dimensions of the first semiconductor chip and the second semiconductor chip in the second direction, the second direction being perpendicular to the first direction.

11. The semiconductor device according to claim 10, wherein a surface roughness of the separation area is smaller than a surface roughness of the adhesion area.

12. The semiconductor device according to claim 10, wherein a distance between the separation area and the encapsulant is equal to or less than 5 micrometers.

13. The semiconductor device according to claim 10, wherein an outline of the separation area is a rectangle, a polygon, a circle, an ellipse, or an oval.

14. The semiconductor device according to claim 10, wherein the separation area extends so as to reach at least one of the first joint area and the second joint area.

15. The semiconductor device according to claim 10, wherein the separation area is separated from at least one of the first joint area and the second joint area by the adhesion area.

16. The semiconductor device according to claim 10, wherein
the separation area is a single area, and
the separation area exists between the first joint area and the second joint area.

17. The semiconductor device according to claim 10, wherein
the separation area includes a plurality of separation areas, and
the plurality of separation areas exists between the first joint area and the second joint area.

18. The semiconductor device according to claim 10, further comprising:
a third semiconductor chip located on the first conductor plate; and
a third conductor spacer interposed between the third semiconductor chip and the lower surface of the second conductor plate,
wherein
the lower surface of the second conductor plate further comprises a third joint area where the third conductor spacer is joined and a second separation area from which the encapsulant is separated,
the adhesion area further surrounds the third joint area and the second separation area, and
the second separation area is located between the second joint area and the third joint area.

* * * * *